United States Patent
Luo et al.

(10) Patent No.: US 8,890,280 B2
(45) Date of Patent: Nov. 18, 2014

(54) TRENCH-TYPE SEMICONDUCTOR POWER DEVICES

(75) Inventors: Xiaorong Luo, Chengdu (CN); Guoliang Yao, Chengdu (CN); Tianfei Lei, Chengdu (CN); Yuangang Wang, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 195 days.

(21) Appl. No.: 13/033,701

(22) Filed: Feb. 24, 2011

(65) Prior Publication Data
US 2012/0168856 A1 Jul. 5, 2012

(30) Foreign Application Priority Data
Dec. 29, 2010 (CN) .......................... 2010 1 0610944

(51) Int. Cl.
| | | |
|---|---|---|
| H01L 23/58 | (2006.01) | |
| H01L 29/78 | (2006.01) | |
| H01L 29/06 | (2006.01) | |
| H01L 29/66 | (2006.01) | |
| H01L 29/739 | (2006.01) | |
| H01L 21/265 | (2006.01) | |
| H01L 29/08 | (2006.01) | |

(52) U.S. Cl.
CPC .......... H01L 29/7813 (2013.01); H01L 29/634 (2013.01); H01L 29/0653 (2013.01); H01L 29/66734 (2013.01); H01L 29/7397 (2013.01); H01L 21/26586 (2013.01); H01L 29/0878 (2013.01)
USPC .................................. 257/488; 257/E29.014

(58) Field of Classification Search
USPC ........................... 257/488, E29.014; 438/140
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 7,230,310 B2 | 6/2007 | Chen | |
| 7,230,848 B2 * | 6/2007 | Forbes | ...................... 365/185.03 |
| 7,345,342 B2 * | 3/2008 | Challa et al. | ................... 257/341 |
| 7,427,800 B2 * | 9/2008 | Yilmaz | ......................... 257/488 |
| 2007/0200183 A1 * | 8/2007 | Rueb et al. | .................... 257/401 |

OTHER PUBLICATIONS

Hattori et al. "Shallow angle implantation for extended trench gate power MOSFETs with super junction structure", Proceedings of 2001 International Symposium on Power Semiconductor Devices & ICs, Osaka, Japan, pp. 427-430.
Fujihira, Tatsuhiko, "Theory of Semiconductor Superjunction Devices", Jpn. J. Appl. Phys., vol. 36, part 1, No. 10, pp. 6254-6262, Oct. 1997.

* cited by examiner

*Primary Examiner* — Michael Shingleton
(74) *Attorney, Agent, or Firm* — Calfee, Halter & Griswold LLP

(57) ABSTRACT

The present invention relates to a semiconductor device. The device comprises a semiconductor substrate. A semiconductor drift region is on the semiconductor substrate. The semiconductor drift region comprises a semiconductor region of a first conduction type and a semiconductor region of a second conduction type. The semiconductor region of the first conduction type and the semiconductor region of the second conduction type form a superjunction structure. A high-K dielectric is on the semiconductor substrate. The high-K dielectric is adjacent to the semiconductor region of the second conduction type. An active region is on the semiconductor drift region. A trench gate structure is on the high-K dielectric, the trench gate structure being adjacent to the active region. The semiconductor region of the second conduction type is formed by shallow angle ion implantation, thus its width is narrow and its concentration is high.

8 Claims, 6 Drawing Sheets

TRENCH-TYPE SEMICONDUCTOR POWER DEVICES

RELATED APPLICATIONS

The present application claims priority from Chinese Patent Application Serial No. 201010610944.2, filed Dec. 29, 2010, which is incorporated by reference in its entirety.

FIELD OF THE INVENTION

The present invention relates to semiconductor power devices, and more particularly relates to low power consumption semiconductor power devices with a trench gate structure.

BACKGROUND OF THE INVENTION

A power MOSFET (metal oxide semiconductor field-effect transistor) is a major carrier conduction type device with its advantages such as high input impedance, fast speed, high frequency, on-resistance with a positive temperature coefficient, wide safety operation area, and usable in parallel. These advantages enable it to be widely used in fields such as industrial control, communication, automobile, computer, portable appliances, home appliances and office appliance. In particular, its application in the switch power supply grows rapidly, thus greatly improving the efficiency in the electronic system.

A long and low doping concentration drift region is required to sustain high breakdown voltage (BV) in a high-voltage device. However, both the long drift region and the low doping concentration will increase the on-resistance ($R_{on}$), and thus increase on-state power consumption of the device. There is a relationship of $R_{on} \propto BV^{2.5}$ between BV and $R_{on}$.

The reduction in the specific on-resistance ($R_{on,sp}$) of a conventional planar gate VDMOS (vertical double diffusion metal oxide semiconductor) is limited by JFET (junction field-effect transistor) effect as the cell density on a chip increases. A trench MOSFET not only eliminates JFET effect, but also has high channel density, which leads to a low $R_{on,sp}$. However, for a high voltage and high current trench MOSFET, the drift region resistance constitutes most part of the total resistance of the device; the problem of silicon limit is thus still not solved.

U.S. Pat. No. 4,754,310 by Coe D. J. from PHILIPS CORP [US], titled High Voltage Semiconductor Device, filed in 1988, proposed for the first time a method of taking the alternate p-column region and n-column region as a voltage-sustaining region in a lateral high-voltage MOSFET (LD-MOSFET) to replace the lightly-doped drift region of single conduction type (n type or p type) in the traditional power devices as a voltage-sustaining layer.

In U.S. Pat. No. 521,627, 1993, semiconductor power devices with alternation conductivity type high-voltage breakdown regions, an alternate p-column region and n-column region as a drift layer, called "composite buffer layer", is used in a longitudinal power device, particularly a longitudinal MOSFET.

In 1997, Tatsuhiko Fujihira (theory of semiconductor superjunction devices, Japanese Journal of Applied Physics, 1997) generalized the above concepts and proposed a "superjunction theory". Thereafter, the concept of "superjunction (SJ)" is cited and further verified by many device researchers.

As for the voltage-sustaining layer of a superjunction MOSFET, in addition to the depletion along a direction of source-drain region, the p-column region and n-column region therein are mutually depleted, thus the entire voltage-sustaining layer is fully depleted under higher drain voltage, similar to an intrinsic layer, thereby the breakdown voltage of the device may be improved. Meanwhile, a higher concentration may be used in the n-column region in the superjunction, thereby facilitating the reduction of the on-resistance.

The SJ structure is introduced into a power VDMOS to reduce the $R_{on}$ and maintain a high BV. However, the fabrication process of a high performance superjunction VDMOS is relatively complex and costly. First, the higher the BV of a VDMOS is, the deeper the longitudinal p-column and n-column are. The conventional "superjunction" structure is formed by multiple implantations, multiple epitaxy and annealing. A higher voltage SJ VDMOS are formed by more times the epitaxy and implantations. Therefore, the process becomes more difficult and the cost is higher for a higher breakdown voltage VDMOS. Furthermore, it is very difficult to obtain a high-concentration, narrow-stripe and alternate p- and n-column by using implantations, epitaxy followed by annealing. Second, the electrical properties of the "superjunction" device is very sensitive to charge imbalance, the width and concentration of the p-column region and n-column region must thus be controlled accurately in the process to avoid deterioration of the electrical properties of the device. Third, the reverse recover of the body diode of the device is hardened, and in a high current application, there are problems such as the reduction of the breakdown voltage and the increase of the on-resistance caused by the enlargement of the lateral PN junction depletion layer.

In the document "Shallow Angle Implantation for Extended Trench Gate Power MOSFETs With Super Junction Structure, ISPSD, 2001, Yoshiyuki Hattori, Takashi Suzuki, Masato Kodama, Eiko Hayashii, and Tsutomu Uesugi", it has shown a trench gate superjunction VDMOS where the SJ has been formed by shallow angle implantation in an epitaxial wafer. The process cost to form SJ structure is reduced to some extent. Due to the characteristics of such a process, the p-column or n-column can be made very narrow, thus the process possesses market prospect well in the low power consumption application field. However, such a process also requires accurate control of the thickness of the oxide layer through which the impurities are implanted, and the breakdown voltage is improved in a limited range.

In his U.S. Pat. No. 7,230,310B2, it has proposed an idea of improving electrical properties by using p- or/and n-column semiconductor region and high-K dielectric region. The structure enlarges the safety operation area, reduces the on-resistance of the device in high current application. In this structure, firstly, the HK dielectric is placed outside the region below the gate; secondly, the gate is a planar gate not a trench gate, and the trench filled with high k dielectric therefore is formed by separately etching; thirdly, the patent has not presented how to manufacture the SJ in the proposed structure, just describe the method for forming p- or n-column with HK dielectric region in a cell. It is very difficult to form a high-concentration, narrow-stripe and alternate p- and n-column if using implantations, epitaxy followed by annealing.

SUMMARY OF THE INVENTION

The present invention aims to solve one or more of the above problems.

In one aspect, the present invention proposes a semiconductor device, comprising:
a semiconductor substrate,
a semiconductor drift region on said semiconductor substrate, the semiconductor drift region comprising a semiconductor region of a first conduction type and a semiconductor region of a second conduction type, the semiconductor region of the first conduction type and the semiconductor region of the second conduction type forming a superjunction structure; the semiconductor region of the second conduction type having a narrow width and high doping concentration and being formed by shallow angle ion implantation;

a high-K dielectric on said semiconductor substrate, the high-K dielectric being adjacent to said semiconductor region of the second conduction type;

an active region on said semiconductor drift region; and a trench gate structure on said the high-K dielectric, the trench gate structure being adjacent to said active region.

The semiconductor device according to the present invention has the advantageous such as low on-resistance, low power consumption, insensitive to imbalance charges, high breakdown voltage, simple manufacturing process and low cost.

In accordance with one embodiment of the present invention, a SJ device structure having a trench filled with high-K dielectric is proposed, the structure comprising: a trench gate structure consisting of a gate dielectric layer and a conductive material enclosed by the gate dielectric layer; an active region on both sides of the trench gate structure, which includes a well region as well as a source region and a body contact region in the upper portion of the well region; a trench (which is also called an extended trench) filled with high-K dielectric below the trench gate. Superjunctions formed by an n-column region and a p-column region below the active region and on both sides of the extended trench, which constitute the drift region of the device, and the drift region being in contact with the extended trench; the n-column, the p-column and the extended trench are parallel to each other; the superjunctions are bilaterally symmetrical with respect to the extended trench; the n-column has a width equal to or smaller than that of the p-column; the n-column has a longitudinal length equal to that of the p-column, the longitudinal length of the high-K dielectric is equal to or less than that of the n-column region; and a substrate layer is provided at the bottom of the device.

The K value of the high-K dielectric may be determined by a specific material, and the property of the material of the high-K dielectric should be considered comprehensively.

In accordance with the present invention, the bottom of the trench gate structure is flush with or lower than the bottom of the active layer.

In accordance with the present invention, the gate dielectric is a high-K dielectric or silicon dioxide. The high-K dielectric constituting the gate dielectric is identical to or different from the high-K dielectric within the extended trench.

In accordance with the present invention, the extended trench may be formed by dry etch. Since the anisotropic property of the dry etch is good, the trench obtained is approximately rectangle. The extended trench may also be obtained by wet etching, and the trench is approximately of a trapezoidal structure.

In the superjunction, the semiconductor region of the second conduction type in contact with the extended trench is narrow and has a high doping concentration, and is formed by shallow angle ion implantation through both sidewalls of the extended trench, thus the product of the width and the concentration of the semiconductor region of the second conduction type is greater than or equal to that of the semiconductor region of the first conduction type. Preferably, the product of the semiconductor region of the second conduction type is greater than that of the semiconductor region of the first conduction type. Accordingly, one advantage of the present invention is that the on-resistance of the device is low. Besides, the device can be made of a very small area according to the actual requirements and the technological level.

In accordance with the present invention, both the longitudinal lengths of the drift region and the extended trench may be varied, and the breakdown voltage of the device may be varied in a wide range. However, in consideration of the limit of the process cost and the specific on-resistance, this structure has a more obvious advantage in the application of 100-300V breakdown voltage.

The semiconductor device of the present invention is preferably a MOS controlled device, such as VDMOS and IGBT, thereby mitigating the contradictory relationships between BV and $R_{on}$ as well as switching loss.

The semiconductor device of the present invention may be an N-channel device or a P-channel device. Similarly, the p-column region of the P-channel device may be realized by shallow angle implantation.

The semiconductor device of the present invention, if the BV of the device is relatively high, may be manufactured to a semi-superjunction structure, that is, an n-type layer exists between the n+ substrate (in the case of N-channel trench gate VDMOS) and the bottoms of the superjunction and the extended trench, to decrease the depth of the extended trench and the difficulty of the shallow angle implantation process. Besides, the n-type layer is also used to sustain a part of the breakdown voltage, thus it is more suitable for the device with higher breakdown voltage (i.e. the breakdown voltage higher than 400V). The doping concentration of the n-type layer is less than the doping concentration of the semiconductor region of the second conduction type in the superjunction structure.

The trench gate SJ VDMOS structure disclosed in the present invention comprises a trench gate structure and a superjunction drift region, wherein the trench gate structure reduces the JFET (junction-type field-effect transistor) effect, and the combination of the trench gate structure and the superjunction drift region greatly reduces the on-resistance; the trench below the trench gate is filled with high-K dielectric, which not only reduces the specific on-resistance, but also reduces the sensitivity of the breakdown voltage to charge imbalance between the n-column region and the p-column region.

The present invention has the following advantageous effects: (1) One major advantage of the present invention is reduction of specific on-resistance ($R_{on,sp}$), with a reduction of 50% in $R_{on,sp}$ relative to the conventional trench gate SJ VDMOS, so a very low conduction loss may be obtained; (2) Since the high-K dielectric is introduced into the inventive structure, which reduces the sensitivity of the BV to the charge imbalance of the superjunction; (3) The combination of the SJ structure and high-K dielectric trench can not only reduce the $R_{on}$ by increasing the concentration of the drift region, but also improve the BV of the device. Moreover, the high-K dielectric alleviates the problem of increase of the on-resistance caused by extension of the lateral depletion layer of pn junction in a high current application. (4) In the superjunction of the present invention, the n-column or p-column which is in contact with the extended trench is narrow and has a high doping concentration. It is formed by using shallow angle ion implantation through two sidewalls of the extended trench instead of using the process of multiple implantations and epitaxy, and thus, the process difficulty and process cost may be reduced. Besides, the variation of the width of the n-column region formed by implantation has not much influence on the device performance, the design and manufacture of the device may have great flexibility. The technique disclosed in the present invention reduces the process difficulty and process cost.

BRIEF DESCRIPTION OF THE DRAWINGS

FIG. 8 is a schematic diagram showing a method of manufacturing the an N-channel VDMOS in the present invention, wherein

DETAILED DESCRIPTION OF THE INVENTION

The present invention will be described in detail in combination with the accompanying drawings.

Figure 1:
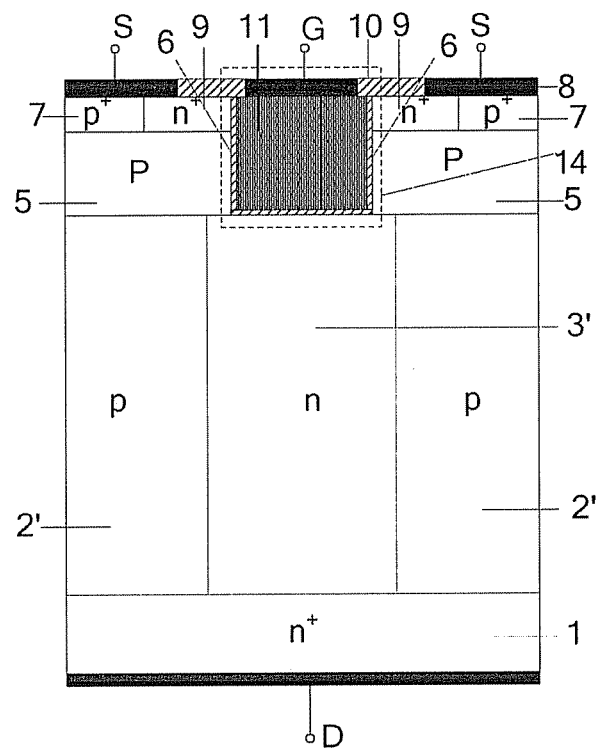
FIG. 1 is a schematic diagram of a conventional N-channel trench gate superjunction VDMOS structure.

The schematic diagram of a conventional trench gate superjunction VDMOS is shown in FIG. 1. A drift region is on semiconductor substrate 1. The drift region comprises alternating p-type semiconductor region 2' and n-type semiconductor region 3'. The p-type semiconductor region 2' and n-type semiconductor region 3' are in a column shape (also called p-column region and n-column region), and the p-type semiconductor region 2' and n-type semiconductor region 3' form a superjunction structure. The n-type semiconductor region 3' is directly below the trench gate structure 14 with its width equal to or greater than that of the trench gate structure. The trench gate structure comprises a gate dielectric 6 and a conductive material 11 enclosed by the gate dielectric. From the surface of the conductive material 11, a gate electrode G is extracted. Preferably, the product of the lateral width and the doping concentration of the p-type semiconductor region 2' should be equal to that of the n-type semiconductor region 3' so that the charges are in balance between n- and p-column 3' and should be fully depleted in a blocking situation. An active region is on the p-type semiconductor region 2' and the n-type semiconductor region 3', comprising a p-type well region 5, and a p+ semiconductor region 7 (that is, a body contact region) as well as an n+ semiconductor region 9 (that is, a source region) in the upper portion of the p-type well region 5. A source electrode S is formed on part of the surfaces of the p+ semiconductor region 7 and n+ semiconductor region 9. A drain electrode D is formed on the lower surface of the n+ semiconductor substrate 1.

Figure 2A:
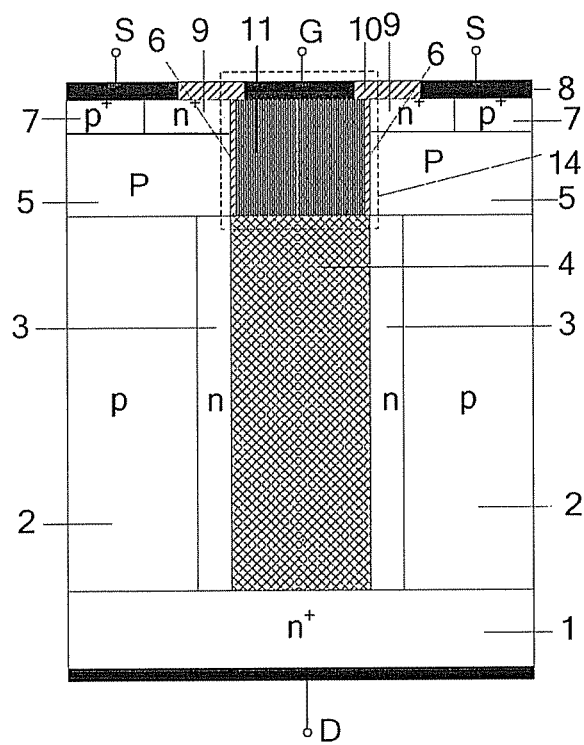
FIG. 2a is a schematic diagram of an N-channel trench gate superjunction VDMOS structure according to an embodiment of the present invention.

The structure of the semiconductor device in the present invention is illustrated by taking an N-channel VDMOS as an example with reference to FIG. 2a.

In FIG. 2a, reference 1 represents a semiconductor substrate, which is an n+ semiconductor substrate in the case of an N-channel VDMOS. On the semiconductor substrate 1, a p-type semiconductor region 2, an n-type semiconductor region 3 and a dielectric with a high constant (high K-dielectric) 4 are formed in this order from left to right. The p-type semiconductor region 2 and the n-type semiconductor region 3 form superjunction structures of the present invention, thus forming a drift region of the semiconductor device. The inner surface of the n-type semiconductor region 3 defines a trench (which is also called extended trench) filled with the high-K dielectric 4. The superjunction structures are symmetrically distributed on both sides of the extended trench.

An active region is on the said drift region. The active region comprises a p-type well region 5 as well as a p+ semiconductor region 7 (that is, body contact region) and an n+ semiconductor region 9 (that is, source region) in the upper portion of the p-type well region 5. A trench gate structure 14 is above the high-K dielectric 4, comprising a gate dielectric 6 and a conductive material 11 surrounded by the gate dielectric 6. From the surface of conductive material 11, a gate electrode G is extracted. Preferably, the conductive material 11 is formed of polysilicon. The gate dielectric 6 is made of high-K dielectric or silicon dioxide. The high-K dielectric constituting the gate dielectric 6 may be identical to or different from the high-K dielectric within the extended trench.

The gate dielectric 6 is disposed between the conductive material 11 and the p-type well region 5 as well as the n+ semiconductor region 9. A patterned metal layer 8 that forms the source electrode (S) on part of the surfaces of the p+ semiconductor region 7 and the n+ semiconductor region 9, and forms the gate electrode (G) on part of the surface of the conductive material 11. An insulation layer 10 is in the gap of the patterned metal layer 8. A metal layer that functions as the drain electrode (D) of the device is formed on the lower surface of the semiconductor substrate 1.

In the present invention, the p-type semiconductor region 2, the n-type semiconductor region 3 and/or the high-K dielectric 4 are preferably in a column shape (so the p-type semiconductor region 2 and the n-type semiconductor region 3 are also called p-column region 2 and n-column region 3) and are perpendicular to the semiconductor substrate 1. In this case, the high-K dielectric has a cross-sectional shape of rectangle. However, the p-type semiconductor region 2, the n-type semiconductor region 3 and/or the high-K dielectric 4 may be also of other shapes, for example, the high-K dielectric has a cross-sectional shape of trapezoid or triangle.

In the present invention, the p-column region 2 and n-column region 3 on both sides of the extended trench are symmetrical with respect to the extended trench.

Preferably, the n-column region 3 of the present invention is formed by shallow angle ion implantation. The shallow angle ion implantation means that the angle between the ion implantation direction and the normal direction of the surface of the active region is less than 20 degrees; preferably less than 10 degrees; and more preferably between 5 and 10 degrees.

Preferably, the n-column region 3 of the present invention has a width (in the direction parallel to the semiconductor substrate 1) equal to or small than that of the p-type semiconductor region 2.

Preferably, the K value of the high-K dielectric is greater than the K value of the semiconductor material of the drift region. Preferably, the critical electric field of the high-K dielectric is greater than 30V/μm.

The semiconductor drift region may be formed of such semiconductor material as Silicon (K=11.9), Germanium (K=16), Silicon Carbide (K=9.7-10.3), and Gallium Arsenide (K=13.1).

Figure 2B:
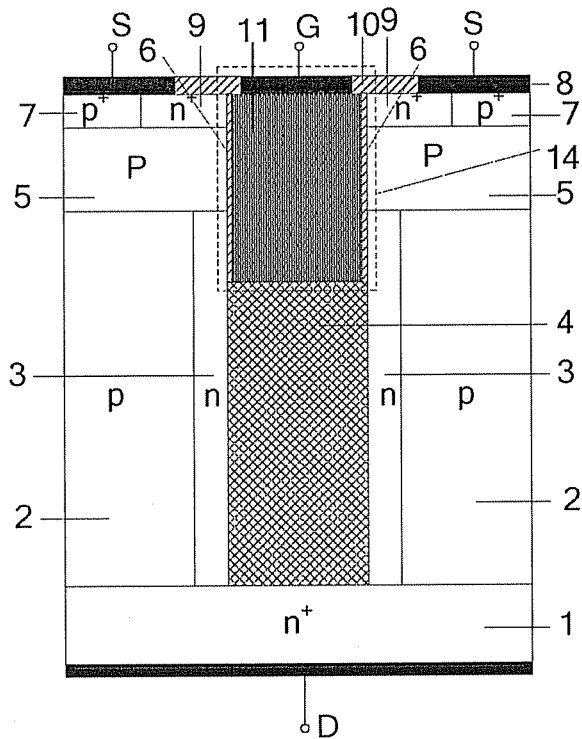
FIG. 2b is a schematic diagram of an N-channel trench gate superjunction VDMOS structure according to another embodiment of the present invention.

In the present invention, the trench gate structure 14 may have a height equal to the thickness of the active layer, and the high-K dielectric 4 may have a height equal to that of the semiconductor drift region. Alternatively, the trench gate structure 14 extends downward beyond the active region such that its height is greater than the thickness of the active region and the height of the high-K dielectric is less than the height of the semiconductor drift region, as seen from FIG. 2b.

Figure 2C:
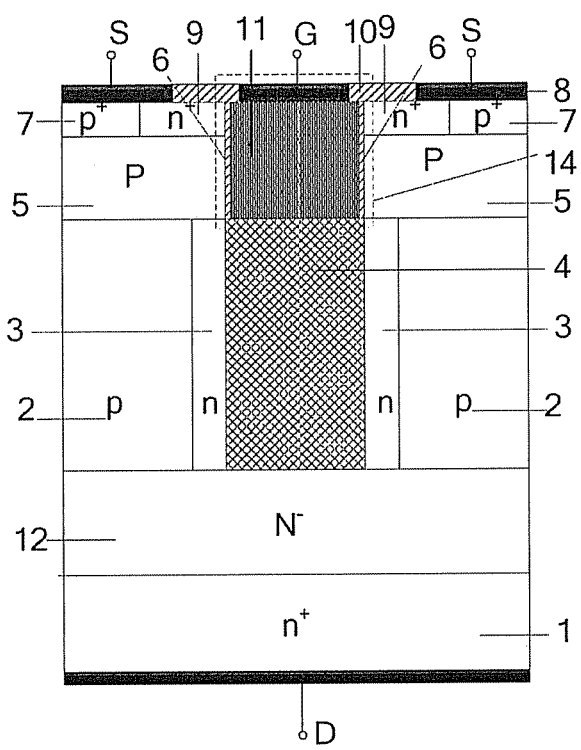
FIG. 2c is a schematic diagram of an N-channel trench gate semi-superjunction VDMOS structure according to a further embodiment of the present invention.

FIG. 2c is a schematic diagram of an N-channel trench gate VDMOS structure according to a further embodiment of the present invention. It differs from the embodiment in FIG. 2a in that: a lightly-doped semiconductor layer 12 is provided above the semiconductor substrate 1 and below the superjunction (consisting of the p-column 2 and the n-column 3) as well as the high-K dielectric 4, thereby forming a semi-superjunction structure. Due to the existence of the slightly-doped semiconductor layer 12, the height of the p-column 2 and the n-column 3 may be less than the height in FIG. 2a, thus the manufacture process is simplified. The doping type of the semiconductor layer 12 is the same as that of semiconductor region 3, but its doping concentration is lower than that of the semiconductor region 3.

Figure 3:
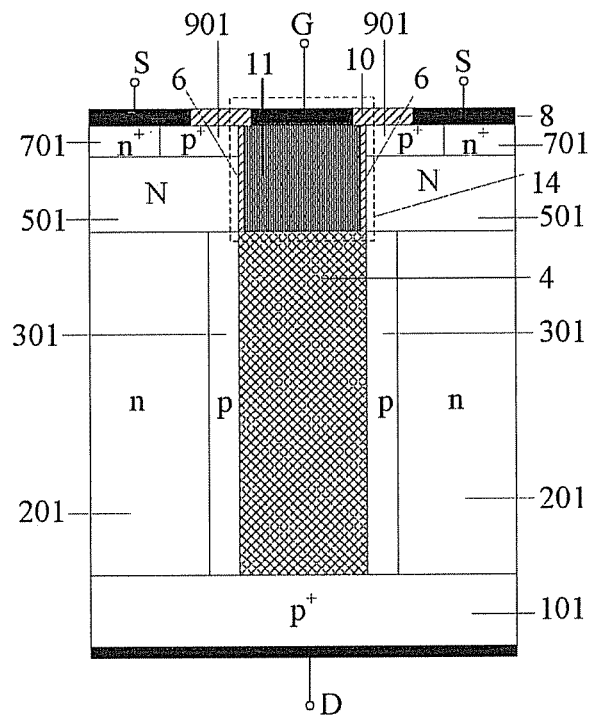
FIG. 3 is a schematic diagram of a P-channel trench gate superjunction VDMOS structure according to an embodiment of the present invention.

The structure of the semiconductor device in the present invention is illustrated by taking the N-channel VDMOS as an example, but the structure herein is also applicable to a p-channel VDMOS. For example, the structure of VDMOS in FIG. 3 corresponds to that of VDMOS in FIG. 2a, only the conduction type of each semiconductor region changes correspondingly. To be distinguished with the n-channel VDMOS, suffix 01 is added with respect to the references in FIG. 2a.

Figure 4:
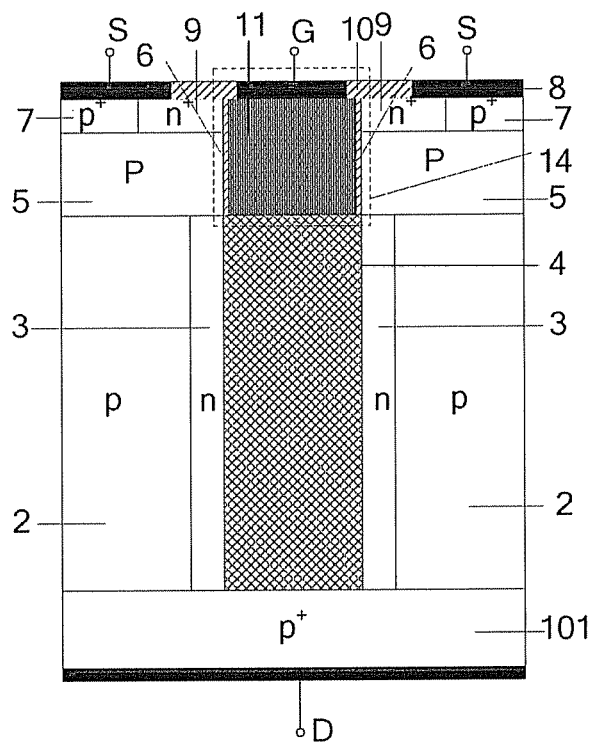
FIG. 4 is a schematic diagram of an N-channel trench gate superjunction IGBT structure according to an embodiment of the present invention.

In addition, the VDMOS is only an example of the semiconductor device in the present invention. For example, the semiconductor device in the present invention may also include N-channel and P-channel IGBTs. FIG. 4 illustrates an N-channel IGBT according to an embodiment of the present invention. The mainly difference between the device in FIG. 4 and the device in FIG. 2 lies in substituting a p+ semiconductor substrate 101 for the n+ substrate 1 in FIG. 1. The semi-superjunction structure illustrated in FIG. 2(c) is also applicable to the IGBT.

The above structure in the present invention obviously improves the on-state characteristics of the device, increases the breakdown voltage of the device and reduces the sensitivity of the breakdown voltage to charge imbalance. For example, the on-resistance is almost 50% decreased.

The advantages of the present invention are further set forth by the comparison between the semiconductor device of the present invention in FIG. 2a and the conventional VDMOS structure in FIG. 1 as follows:

1. Analysis of the Device Characteristics

1) On-Resistance

The on-resistance $R_{on}$ of the conventional trench gate VDMOS structure mainly consists of a drift region resistance $R_D$, an accumulation region resistance $R_A$ and a channel resistance $R_{ch}$ connected in series, that is, $R_{on}=R_D+R_A+R_{ch}$.

The parameters of the channel region of the semiconductor device in the present invention may be equal to those of the channel region of the conventional trench gate SJ VDMOS, the respective channel resistance of the two structures may be deemed as equal.

The accumulation region resistance is related to the parameters such as the width of the n-column region (N-channel) covered by the polysilicon gate. In the semiconductor device of the present invention, the p-type well region is above the n-column region, and the high-K dielectric is below the polysilicon, thus the resistance of the accumulation region may be ignored.

The drift region resistance $R_D$ is mainly related to the concentration, width and length of the drift region as well as the extension effect of current. Since the structure proposed by the present invention employs the high-K dielectric and SJ structure. The n-column region 3 is very narrow in the SJ structure, and the n-column region 3 has an optimized concentration not only far higher than that of the n-column region of the conventional trench gate SJ VDMOS, but also higher than the concentration of the n-column region required by the charge balance in the present invention (that is, the product of the concentration and the lateral width of the n-column region is greater than that of the p-column region), and the current is evenly distributed in the n-column region. Accordingly, the on-resistance of the proposed structure is quite small.

The structure proposed by the present invention obviously reduces the on-resistance and the power consumption of the device.

2) Breakdown Voltage

As compared with the conventional trench gate SJ VDMOS, the structure in the present invention has a modulation effect on the body electric field, which leads to an increase of 12% in the BV. Furthermore, the breakdown voltage is not so sensitive to the charge imbalance due to the high-K dielectric, the process difficulty is thus reduced.

The above analysis shows that as compared with the conventional VDMOS SJ structure, the present invention has a reduction in the $R_{on,sp}$ by 50% and an slight increase in the BV. In addition, the structure in the present invention also has the advantages of simple manufacture process and insensitive to charge imbalance effect.

3) Evaluation of Device Performance

Taking the influence of various parameters on the device performance and the process difficulty into account, the structure model of the device in the present invention is established in accordance with FIG. 2a:

The width of the p-column region 2 (called $W_p$) and the concentration of the p-column region 2 (called $N_p$) is 3 μm and $5.9\times10^{15}$ cm$^{-3}$, and the width of the n-column region 3 (called $W_n$) and the corresponding optimized concentration (called $N_n$) is 0.5 μm and $7\times10^{16}$ cm$^{-3}$, respectively. The corresponding extended trench has a width of 5 μm. A trade-off between the breakdown voltage and on-resistance should be obtained in the optimized concentrations of the n-column and p-column. Based on that model, the performance of the device is simulated by using MEDICI simulation software.

4) Off-State Characteristics

Figure 5:
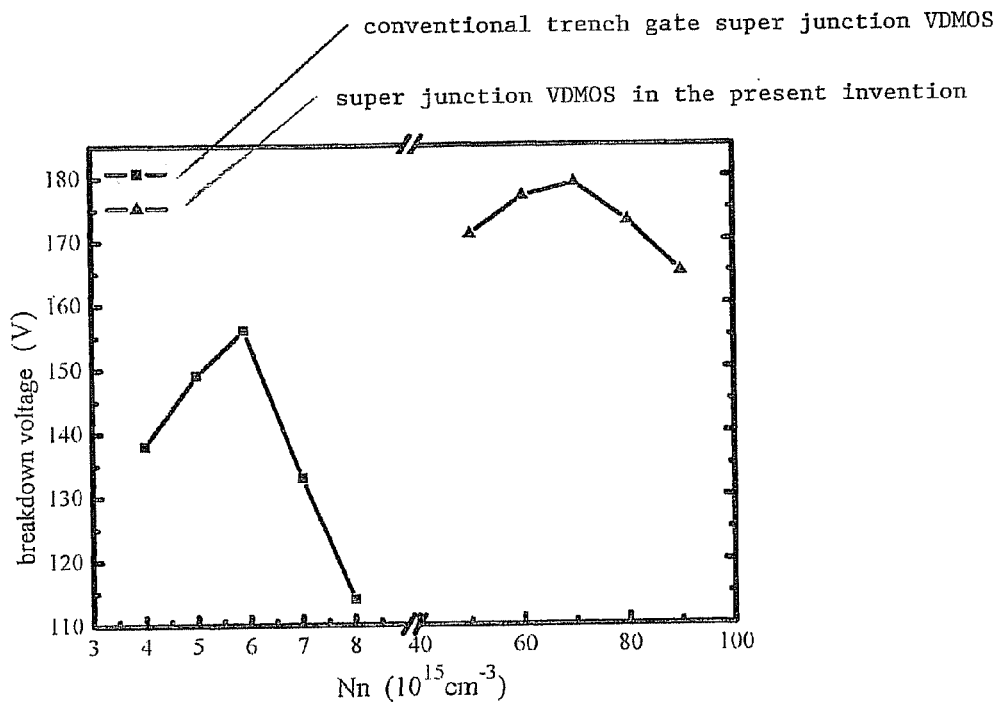
FIG. 5 is a diagram showing the relationships between the breakdown voltage (BV) and the concentration of an n-column region ($N_n$) in a conventional trench gate superjunction VDMOS and that of the semiconductor device of the present invention.
Figure 6:
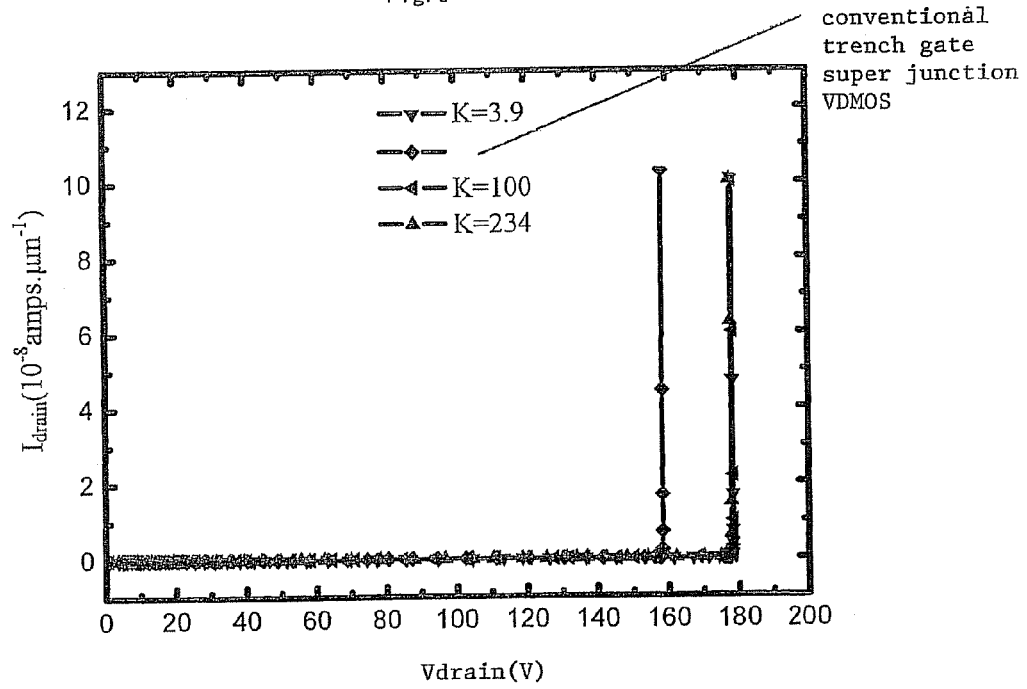
FIG. 6 is a diagram showing the comparison of blocking characteristics of the conventional trench gate superjunction VDMOS and the present semiconductor device when high-K dielectric is of different K values.
Figure 7:
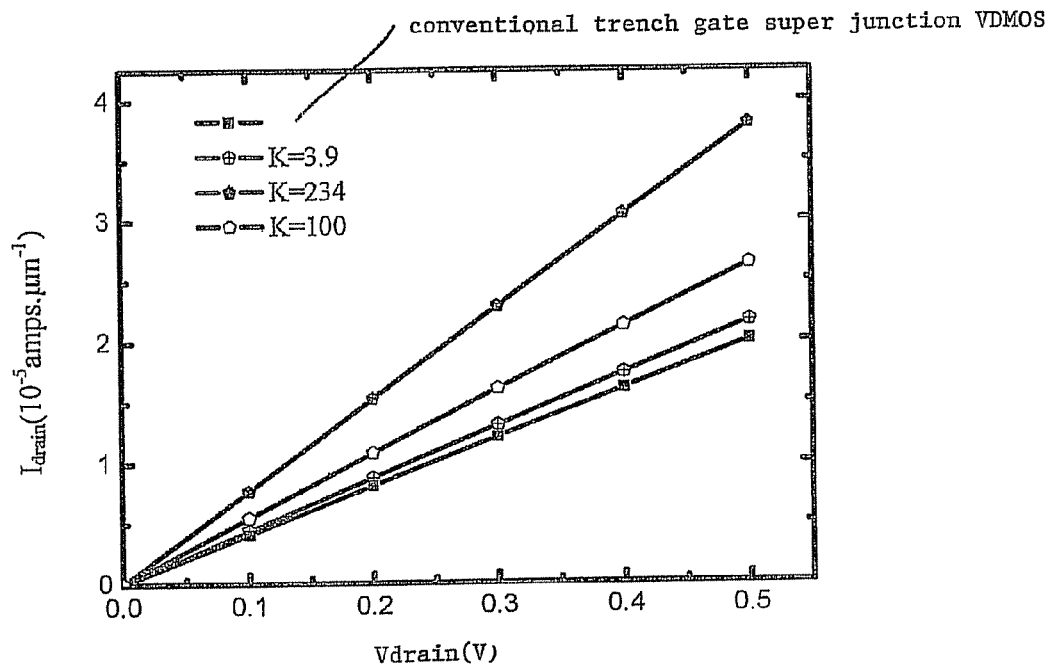
FIG. 7 is a diagram showing the comparison of on-state characteristics of the conventional trench gate superjunction VDMOS and the present semiconductor device when high-K dielectric is of different K values.

In FIGS. 5-7, $N_n$ represents the concentration of the n-column region, $V_{drain}$ represents the voltage of the drain, $I_{drain}$ represents the current of the drain, and BV represents the breakdown voltage.

The dependence of BV on $N_n$ in the conventional trench gate SJ VDMOS (see FIG. 1) is as shown by the curve on the left of FIG. 5. The dependence of BV on $N_n$ of the SJ VDMOS in the present invention is as shown by the curve on the right of FIG. 5.

The optimized $N_n$ in the present invention is one order of magnitude higher than that of the conventional trench gate SJ VDMOS, the on-resistance and the conduction loss are thus reduced, as shown in FIG. 5. Furthermore, the sensitivity of the BV to the variation of concentration (charge imbalance) is reduced; the process tolerance is therefore larger. Moreover, the highest BV of the semiconductor device in the present invention is about 20V higher than that of the conventional trench gate SJ VDMOS.

It can be seen from FIG. 5 that: (1) the conventional trench gate SJ VDMOS has the highest BV at charge balance ($3 \times 10^{-4}$ cm$\times 5.9 \times 10^{16}$ cm$^{-3} \approx 3 \times 10^{-4}$ cm$\times 5.9 \times 10^{15}$ cm$^{-3}$, i.e. $W_p \times N_p = W_n \times N_n$). (2) The optimized $N_n$ in the device structure of the present invention is larger than the balance concentration between the n-column and p-column, that is, $0.5 \times 10^{-4}$ cm$\times 7 \times 10^{16}$ cm$^{-3} > 3 \times 10^{-4}$ cm$\times 5.9 \times 10^{15}$ cm$^{-3}$ (i.e. $W_p \times N_p = W_n \times N_n$), which is helpful for reducing the on-resistance. (3) As compared with the conventional trench gate SJ VDMOS, the BV of the device structure of the present invention is insensitive to the variation of concentration of the n-column region.

The I-V curves in the off-state of the conventional trench gate SJ VDMOS and the device structure of the present invention under different K values are compared in FIG. 6. It can be seen from FIG. 6 that the BV of the device structure of the present invention is insensitive to the variation of K value.

5) On-State Characteristics

The on-state characteristics of the conventional trench gate SJ VDMOS and the device structure of the present invention under different K values are compared in FIG. 7. At a given drain current, the device structure of the present invention has a very low on-state voltage drop. The larger the K value is, the lower the on-resistance is. This is mainly a result of combined influence of the high-K dielectric and the SJ structure in the device structure of the present invention.

Figure 8A:
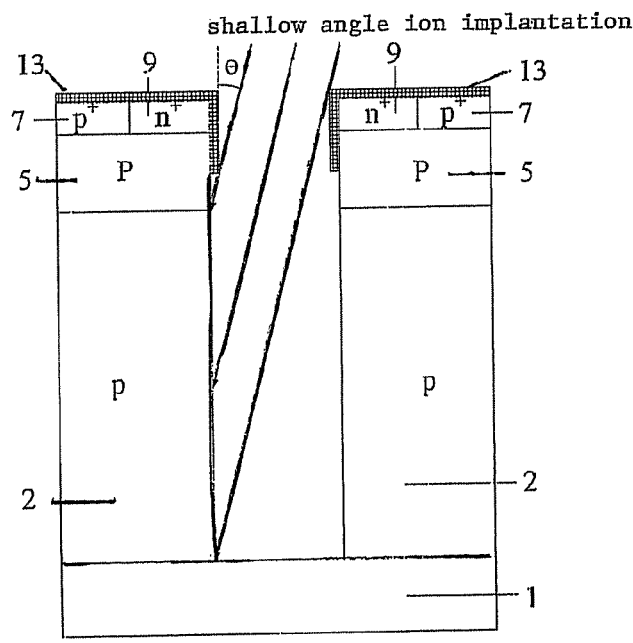
FIG. 8a is a schematic diagram of a shallow angle implantation.
Figure 8B:
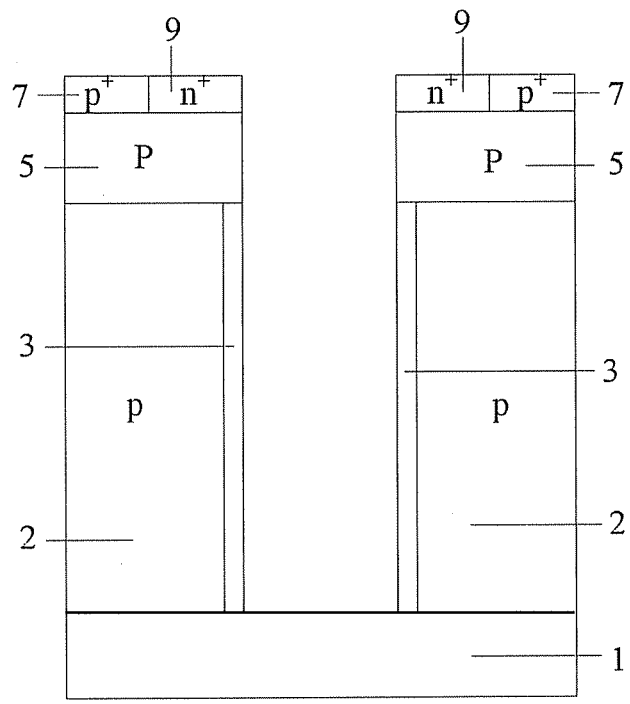
FIG. 8b is a schematic diagram of a narrow n-column region formed by a shallow angle implantation.
Figure 8C:
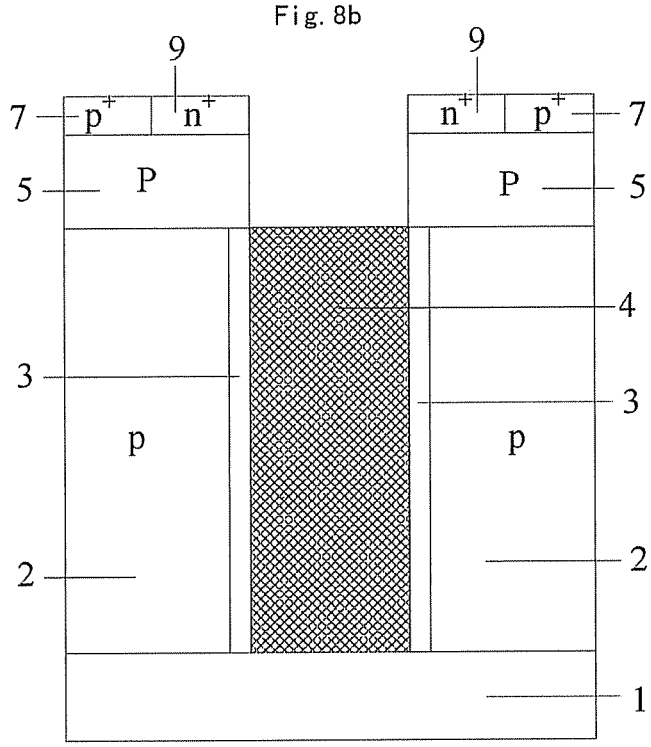
FIG. 8c is a schematic diagram of the semiconductor device filled with the high-K dielectric.

FIG. 8 shows formation of the n-column 3 of the VDMOS in the present invention (in FIG. 2a, taking the N-channel VDMOS as an example) by shallow angle implantation and annealing followed by filling of the high-K dielectric. First, a highly doped substrate, a p-type semiconductor epitaxial layer in a drift region and an active region are formed by conventional processes. Then a trench is formed by etching downward from the surface of the active region to the upper surface of the semiconductor substrate using dry etch. Two sidewalls of the trench are changed from p-type to n-type via mask 13 to implant n-type impurities by using a shallow angle implantation, thereby forming a narrow n-column region 3 with a high concentration. Thus symmetrical p-column region 2 and n-column region 3 are formed on both sides of the trench, see FIGS. 8a and 8b. The trench is filled with the high-K dielectric, the thickness of which can be equal to (or less than) the thickness of the n-column region, see FIG. 8c. Finally, a trench gate structure is formed. The shallow angle implantation here may refer to the document titled Shallow Angle Implantation for Extended Trench Gate Power MOSFETs With Super Junction Structure, ISPSD, 2001, Yoshiyuki Hattori, Takashi Suzuki, Masato Kodama, Eiko Hayashii, and Tsutomu Uesugi.

As compared with the conventional trench gate SJ VDMOS, the $R_{on,sp}$ is reduced by 50% and the BV is slightly increased for the semiconductor device in the present invention. Furthermore, the semiconductor device of the present invention has the advantage of insensitive to the charge imbalance, thus overcomes the most common and difficult problem of the SJ device and increases the flexibility in design and manufacture of the device. In addition, the n-column region or/and p-column region can be very narrow in the present invention, resulting in a reduction in the on-resistance and the pitch of the device. The MOS controlled device in the present invention is most suitable for making the power device with a low power consumption, particular for the power electronics application with a low consumption and BV of 100-300V.

What is claimed is:

1. A semiconductor device, comprising:
a semiconductor substrate,
a semiconductor drift region on said semiconductor substrate, the semiconductor drift region comprising semiconductor regions of a first conduction type and semiconductor regions of a second conduction type, the semiconductor regions of the first conduction type and the semiconductor regions of the second conduction type being alternately arranged to form a superjunction structure, wherein the semiconductor regions of the second conduction type formed by shallow angle ion implantation have a width smaller than or equal to that of the semiconductor regions of the first conduction type;
a high-K dielectric on said semiconductor substrate, which is contacted with and enclosed by said semiconductor regions of the second conduction type;
an active region on said semiconductor drift region, which includes a well region of a first conduction type, a source region of a second conduction type and the body contact region of a first conduction type, wherein said source region and body contact region are on the top part of said well region; and
a trench gate structure on said high-K dielectric, comprising a gate dielectric and a conductive material enclosed by said gate dielectric, said trench gate structure being enclosed by said active region and being adjacent to said source region, wherein said trench gate structure extends from an upper surface to a bottom of the active region.

2. The semiconductor device according to claim 1, wherein the product of the width and the concentration of said semiconductor region of the second conduction type is greater than or equal to that of said semiconductor region of the first conduction type.

3. The semiconductor device according to claim 1, wherein said semiconductor region of the first conduction type, said semiconductor region of the second conduction type, and said high-K dielectric are each in a column shape and perpendicular to the semiconductor substrate.

4. The semiconductor device according to claim 1, wherein a lightly-doped semiconductor layer of a second conduction type is provided between said semiconductor substrate and said high-K dielectric as well as said semiconductor drift region, and the doping concentration of the slightly-doped semiconductor layer is less than the doping concentration of the semiconductor region of said second conduction type in the superjunction structure.

5. The semiconductor device according to claim 1, wherein said shallow angle ion implantation means that the included angle between the ion implantation direction and the normal direction of the surface of said active region is less than 20 degrees.

6. The semiconductor device according to claim 1, wherein the relative dielectric constant of said high-K dielectric is greater than the relative dielectric constant of the semiconductor drift region, and the critical electric field of the high-K dielectric is greater than 30 V/μm.

7. The semiconductor device according to claim 1, wherein the semiconductor material used for the semiconductor drift region includes Silicon, Germanium, Silicon Carbide, or Gallium Arsenide; and the insulation material used for the trench gate dielectric includes silicon dioxide or high-K dielectric.

8. The semiconductor device according to claim 1, wherein said high-K dielectric has a cross-sectional shape of rectangle, trapezoid or triangle.

* * * * *